(12) United States Patent
Chang et al.

(10) Patent No.: US 6,252,160 B1
(45) Date of Patent: Jun. 26, 2001

(54) I/O SHIELD FOR ELECTRONIC ASSEMBLIES

(75) Inventors: Jen-Jou Chang, Yung-Ho; Chin-Yi Lai, Tu-Chen, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/309,146

(22) Filed: May 1, 1999

(30) Foreign Application Priority Data

May 8, 1998 (TW) .................................. 87207127

(51) Int. Cl.[7] .............................. H05K 9/00; H05K 7/14
(52) U.S. Cl. ................... 174/35 R; 174/35 GC; 361/799; 361/800; 361/816; 361/818
(58) Field of Search .................. 174/35 R, 35 GC; 439/607, 609, 540.1, 939; 361/800, 816, 818, 686, 683, 825

(56) References Cited

U.S. PATENT DOCUMENTS

| | | | |
|---|---|---|---|
| 5,467,254 | * 11/1995 | Brusati et al. | 361/799 |
| 5,564,930 | * 10/1996 | Yu | 439/61 |
| 5,684,271 | * 11/1997 | Scholder et al. | 174/35 R |
| 5,742,003 | * 4/1998 | Ho | 174/35 R |
| 5,959,244 | * 9/1999 | Mayer | 174/35 GC |

* cited by examiner

*Primary Examiner*—Dean A. Reichard
*Assistant Examiner*—Carmelo Oliva
(74) *Attorney, Agent, or Firm*—Wei Te Chung

(57) ABSTRACT

An I/O shield for an electronic assembly comprises a shielding plate having a reinforcing plate and a resilient plate attached together with a pair of side walls respectively extending from opposite edges thereof and a number of receiving slots disposed therein. The shielding plate is guided into an opening disposed in a chassis of the electronic assembly by the side walls. A number of spaced spring contacts is formed on the side walls by stamping and bending. Each spring contact comprises a base integrally formed with the side wall, a bend and a free end. The tip of the bend is located nearer to the base than to the free end. Thus, the free end will not warp or engage with notches disposed in a peripheral flange of the opening thereby facilitating removal of the I/O shield.

7 Claims, 7 Drawing Sheets

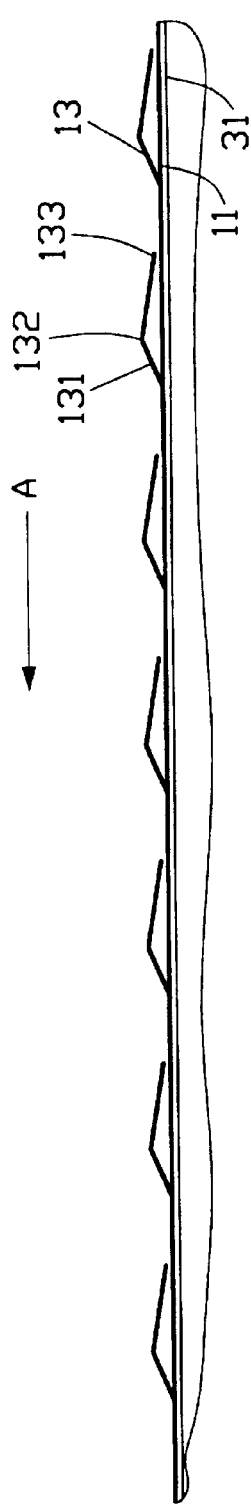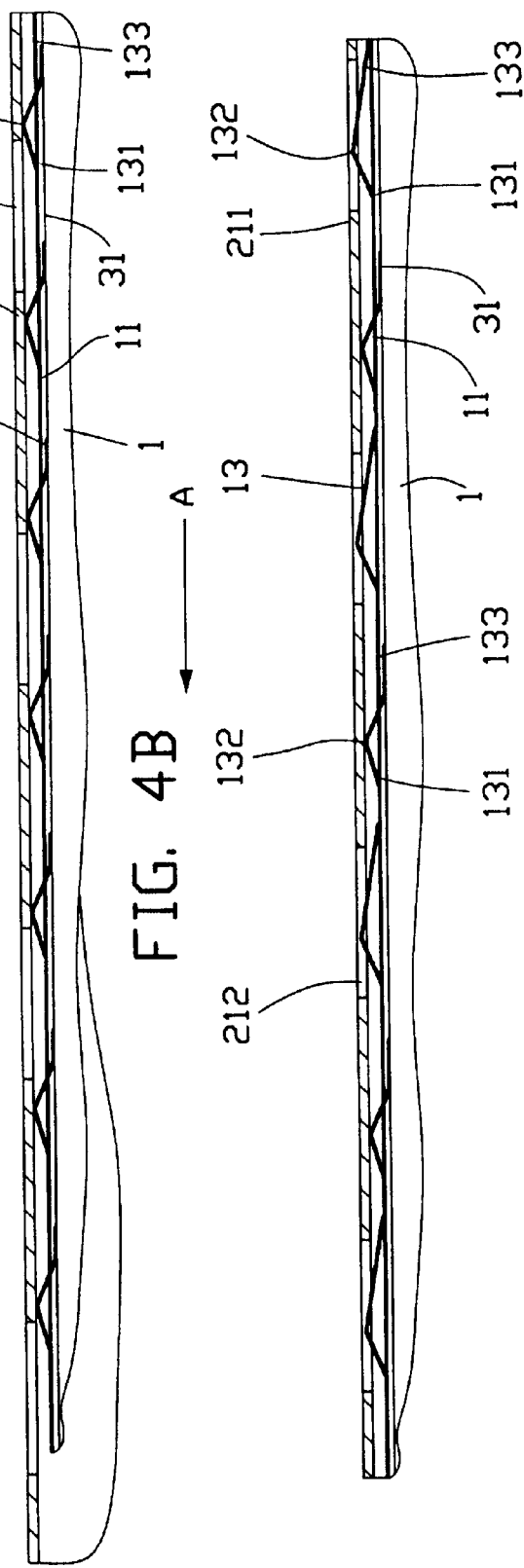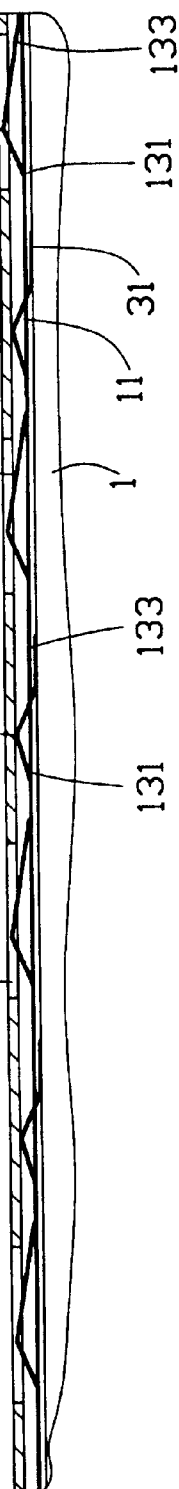

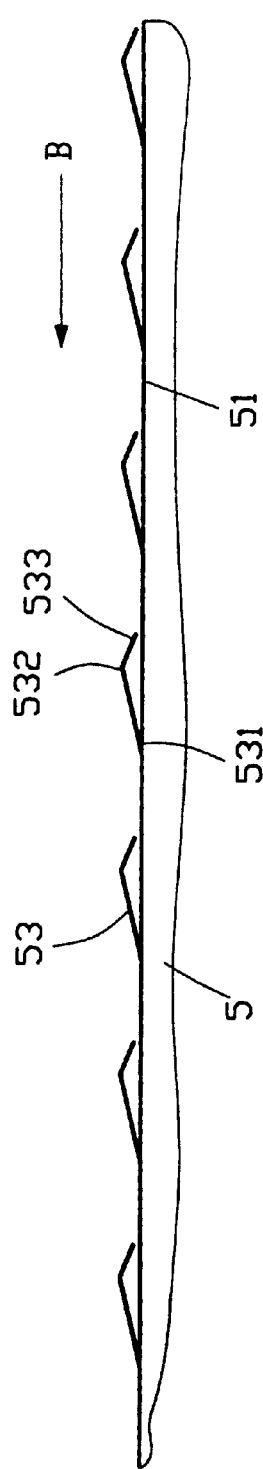
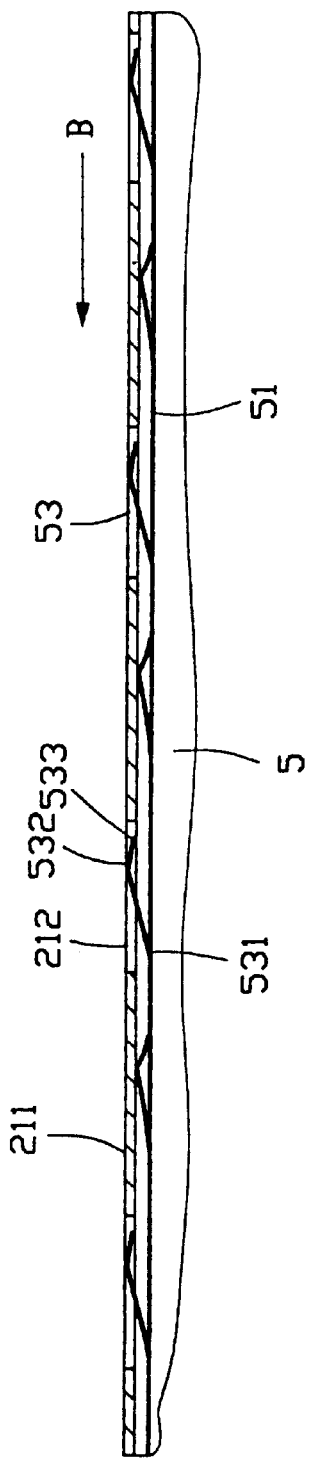
FIG. 7A (PRIOR ART)
FIG. 7B (PRIOR ART)
FIG. 7C (PRIOR ART)

I/O SHIELD FOR ELECTRONIC ASSEMBLIES

BACKGROUND OF THE INVENTION

The present invention relates to an I/O shield inserted into an opening disposed in a chassis of an electronic assembly for shielding a mainboard installed within the electronic assembly and providing connection access for connectors mounted to the mainboard, and more particularly to an I/O shield having spring contacts for facilitating removal of the I/O shield from a chassis of an electronic assembly.

DESCRIPTION OF PRIOR ART

As the development of computer technology further progresses, expansion requirements arise for providing electronic assemblies with additional functions. Thus, it is necessary to add new components to circuit boards installed within the electronic assemblies, or to rearrange the inner space of the electronic assemblies for receiving more components therein thereby supporting additional functions. In most cases, a mainboard is directly attached to the enclosure of the electronic assemblies. In this way, not only does assembly become time consuming, but maintenance also becomes inconvenient. The enclosure must be removed and reinstalled during maintenance, expansion, and replacement of the inner mainboard.

To overcome the deficiency mentioned above, an I/O shield is introduced. Referring to FIG. 6, an opening 21 is defined in a chassis 20 of an electronic assembly 2 for receiving an I/O shield 5. The shield 5 comprises a pair of side walls 51 extending outwardly from opposite edges thereof. The shield 5 is inserted into the opening 21 of the chassis 20 in the direction of arrow "B" with the side walls 51 abutting against a peripheral flange 211 of the opening 21. A plurality of notches 212 is defined in the peripheral flange 211 of the opening 21. A plurality of slots 52 having different shapes is disposed in the shield 5 for providing corresponding connectors (not shown) mounted to a mainboard (not shown) installed within the electronic assembly 2 with connection access for mating with corresponding external connectors and retaining the connectors in position. A plurality of stamped and formed protrusions 53 having an inverse V-shape is formed on the side walls 51.

Also referring to FIGS. 7A and 7B, each protrusion 53 comprises a base 531 integral with the side wall 51, a free end 533 extending beyond the surface of the side wall 51 and a bend 532 formed between the base 531 and the free end 533. The bend 532 of the protrusion 53 is positioned closer to the free end 533 than to the base 531. Thus, the bend 532 is plastically deformed and the base 531 is resiliently deformed when the shield 5 is inserted into the opening 21 of the chassis 20 and the protrusions 53 are pressed by the peripheral flange 211 of the opening 21.

Also referring to FIG. 7C, after the shield 5 is inserted into the chassis opening 21 and some of the protrusions 53 are received in the notches 212 of the peripheral flange 211, the plastically deformed bends 532 of some of the protrusions 53 become upwardly warped thereby causing the free ends 533 thereof to extend through the notches 212. When moving the shield 5 from the opening 21 of the chassis 20 in a reverse direction, the free ends 533 of some of the protrusions 53 hook on the notches 212 of the opening 21 thereby hindering removal of the shield 5.

SUMMARY OF THE INVENTION

Accordingly, an object of the present invention is to provide an I/O shield for facilitating placement and removal of the shield from a chassis of an electronic assembly thereby promoting convenient replacement of components and assembly of the electronic assembly.

Another object of the present invention is to provide an I/O shield for decreasing the size of a gap between the chassis of the electronic assembly and the shield thereby providing enhanced shielding capabilities.

A further object of the present invention is to provide an I/O shield comprising two separate parts having high resiliency and intensity, respectively.

In order to achieve the objects set forth, an I/O shield for an electronic assembly in accordance with the present invention comprises a shielding plate having a reinforcing plate and a resilient plate attached together with a plurality of receiving slots disposed therein and a pair of side walls respectively extends from opposite edges thereof. The shielding plate is guided into a corresponding opening disposed in a chassis of the electronic assembly by the side walls. The slots are engaged with corresponding connectors mounted to an inner mainboard of the electronic assembly and retain the connectors in position. A plurality of spaced spring contacts is formed on the side walls. Each spring contact comprises a base integral with the side wall surface, a free end, and a bend between the base and the free end, wherein the tip of the bend is located nearer to the base than to the free end. When the spring contacts are pressed during assembly, the base of the spring contact is plastically deformed thereby preventing the free end from being warped and engaging with the chassis for facilitating placement and removal of the shield.

Other objects, advantages and novel features of the invention will become more apparent from the following detailed description when taken in conjunction with the accompanying drawings.

BRIEF DESCRIPTION OF THE DRAWINGS

FIGS. 4A through 4C illustrate sequential insertion of the shield into the chassis of the electronic assembly;

FIG. 7A is a cross-sectional view of spring contacts of the conventional shield at an initial state;

FIG. 7B is a cross-sectional view of the spring contacts of the conventional shield and a chassis opening illustrating how the spring contacts deform during insertion; and FIG. 7C is a cross-sectional view of the spring contacts of the conventional shield and the chassis opening illustrating the final state of the spring contacts after insertion.

DETAILED DESCRIPTION OF THE INVENTION

Figure 1:
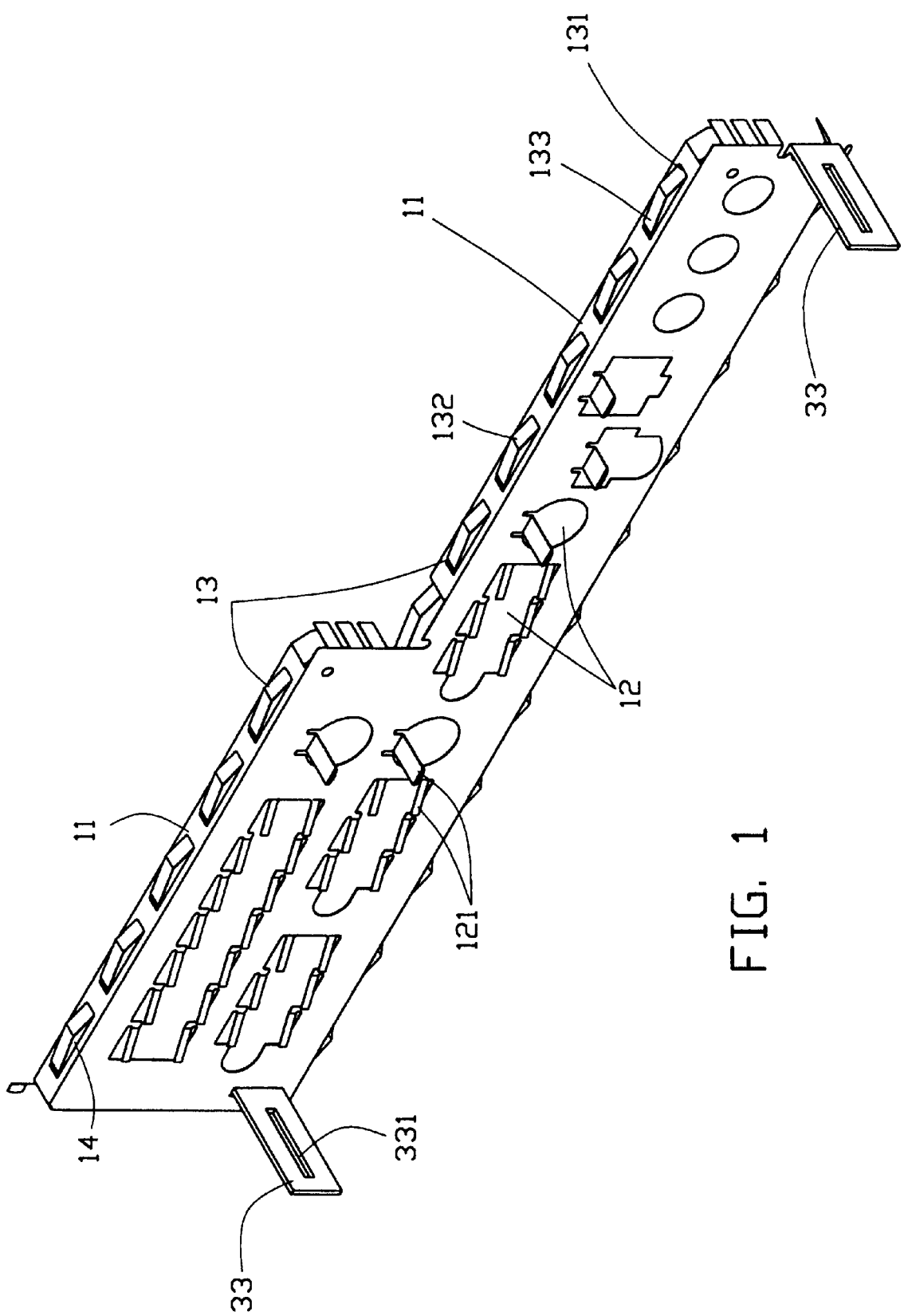
FIG. 1 is a perspective view of an I/O shield in accordance with the present invention.
Figure 2:
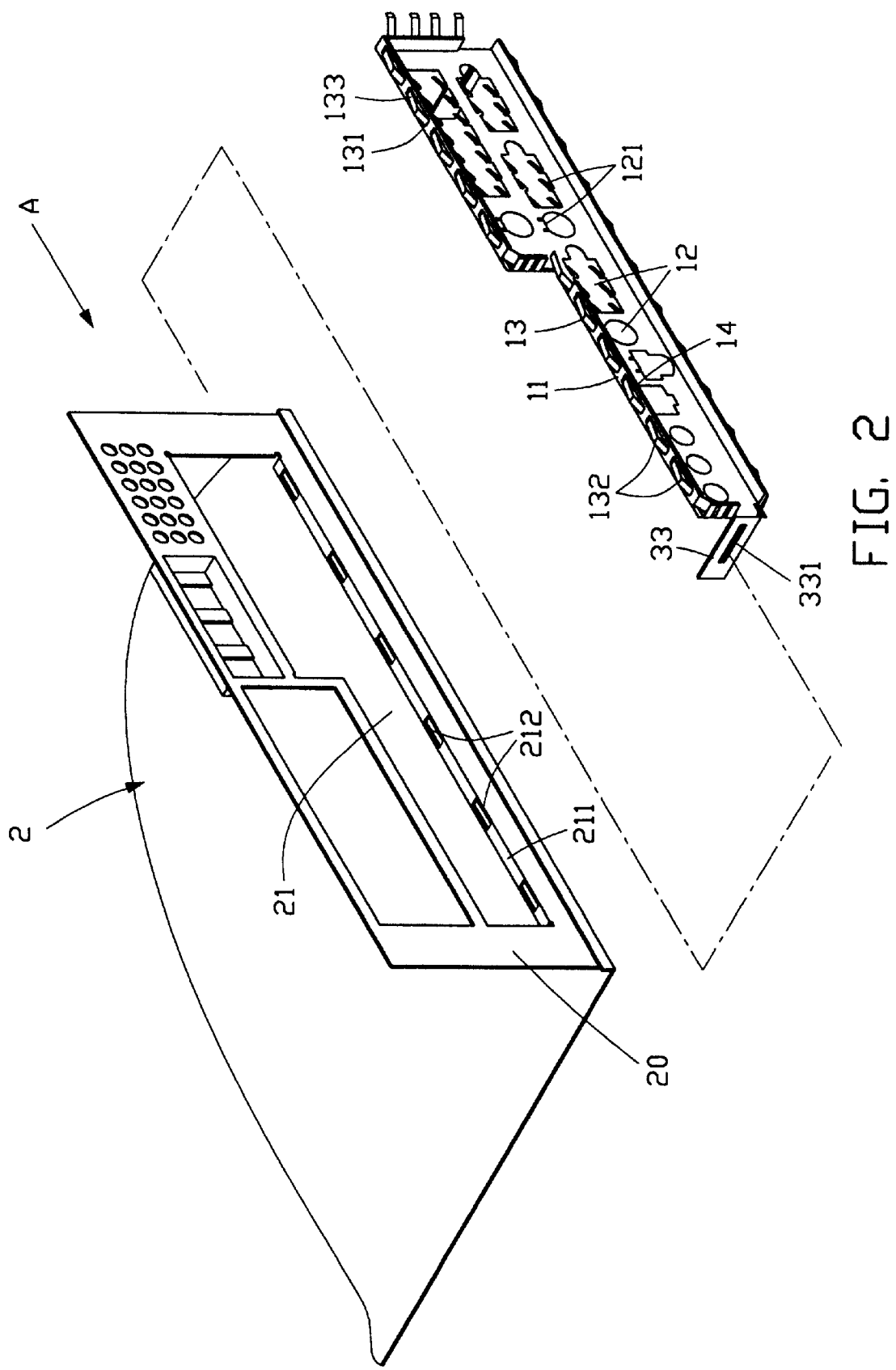
FIG. 2 is a perspective view of the shield of FIG. 1 and a chassis of an electronic assembly illustrating how the shield is attached thereto.

Referring to FIGS. 1 and 2, an I/O shield in accordance with the present invention comprises a shielding plate having a resilient plate 1 and a reinforcing plate 3 (FIG. 3) attached together. The shielding plate has an outer shape corresponding generally to an opening 21 disposed in a chassis 20 of an electronic assembly 2. The shielding plate is inserted into the opening 21 of the electronic assembly 2 in the direction of arrow "A". During insertion, the plate is guided to slide along a peripheral flange 211 of the opening 21 by side walls 11 of the resilient plate 1.

Figure 3:
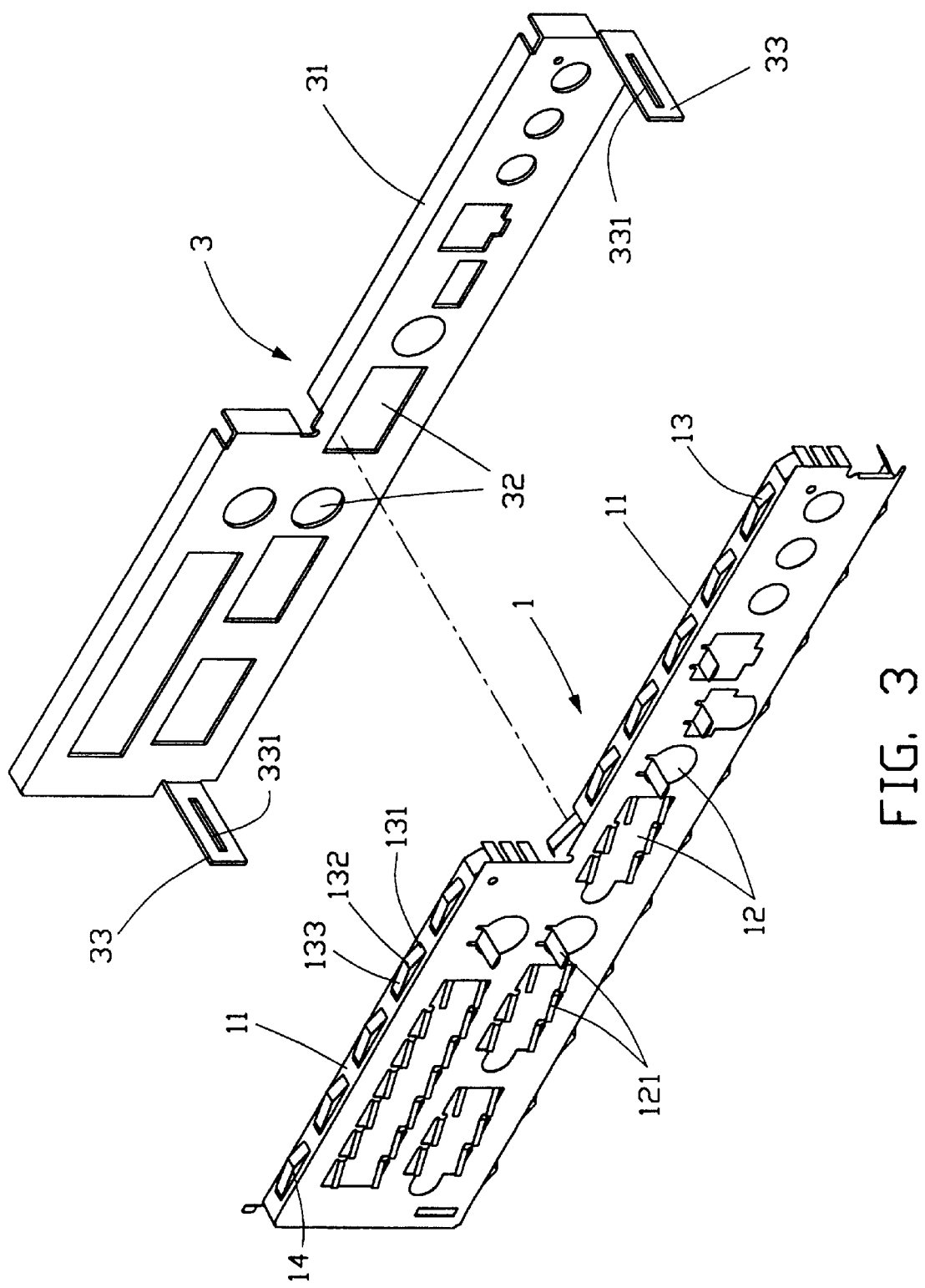
FIG. 3 is an exploded view of FIG. 1 showing a reinforcing plate and a resilient plate.

Also referring to FIG. 3, the resilient plate 1 of the shielding plate made from thin, resilient sheet metal has an outer shape corresponding generally to an opening 21 disposed in a chassis 20 of an electronic assembly 2. The resilient plate 1 comprises a pair of side walls 11 integrally extending from opposite edges thereof in a direction away from an interior of the electronic assembly 2. A plurality of receiving slots 12 having different shapes is disposed in the resilient plate 1 for the extension of mating portions of corresponding connectors (not shown) mounted to sides of a mainboard (not shown) installed within the electronic assembly 2. Each receiving slot 12 has at least one resilient tab 121 formed on an inner surface thereof for abutting against a corresponding connector thereby providing grounding capabilities. A plurality of stamped and bent spring contacts 13 is formed on the side walls 11 each leaving a corresponding through hole 14 defined therein. The spring contacts 13 are adapted for guiding the two attached plates 1, 3 into the chassis opening 21 and decreasing a gap therebetween for providing enhanced shielding capabilities. Each spring contact 13 comprises a base 131 integral with the side wall 11, a free end 133 extending beyond the side wall 11 and an intermediate bend 132, wherein the tip of the bend 132 is located nearer to the base 131 than to the free end 133.

The reinforcing plate 3 made from thick, rigid sheet metal is enclosed by the resilient plate 1 and has an out shape similar to the resilient plate 1. The reinforcing plate 3 comprises a pair of extensions 31 respectively extending from opposite longitudinal edges thereof similar to the side walls 11 of the resilient plate 1 and extending in the same direction as the side walls 11. A plurality of receiving slots 32 having different shapes is disposed in the reinforcing plate 3 corresponding to the slots 12 of the resilient plate 1. A pair of latch members 33 perpendicularly extends from opposite lateral edges of the reinforcing plate 3. Each latch member 33 has an aperture 331 disposed therein for engaging with the mainboard installed with the electronic assembly 2.

Also referring to FIGS. 4A and 4B, since the bases 131 are integral with the side walls 11 of the resilient plate 1 and contact the peripheral flange 211 of the opening 21 first, the spring contacts 13 successfully slide into the opening 21 and are pressed downwards by the peripheral flange 211 with the free ends 133 thereof extending along the extensions 31 of the reinforcing plate 3 in a reverse direction relative to the direction of arrow "A". Referring to FIG. 4C, the bends 132 of some of the spring contacts 13 are received in the notches 212 of the peripheral flange 211. In such a pressed case, since the tips of the bends 132 of the spring contacts 13 are located nearer to the base 131 than to the corresponding free end 133, the bends 132 are resiliently deformed and the bases 131 are plastically deformed. When the bases 131 of the spring contacts 13 are plastically deformed, the resiliently deformed bends 132 resume its original shape and the free ends 133 are urged to move toward the side wall 11 thereby prevented from warping. Hence, when removing the shielding plate together with the mainboard in a reverse direction relative to the arrow "A", the free ends 133 of the spring contacts 13 will not engage with the notches 212 of the peripheral flange 211 thereby facilitating removal of the shielding plate.

Figure 5A:
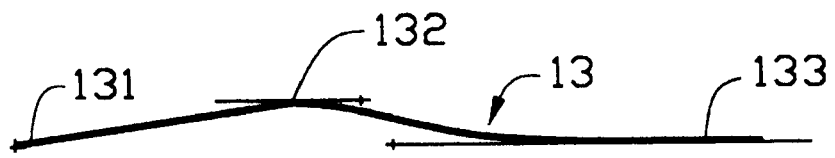
FIG. 5A is a schematic view of a contact spring of the shield depressed by a peripheral flange of a chassis opening of the electronic assembly.
Figure 5B:
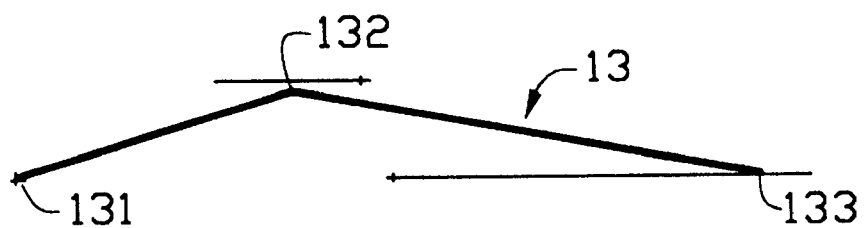
FIG. 5B is a schematic view of the spring contact of the shield recovering after released from pressure.
Figure 5C:
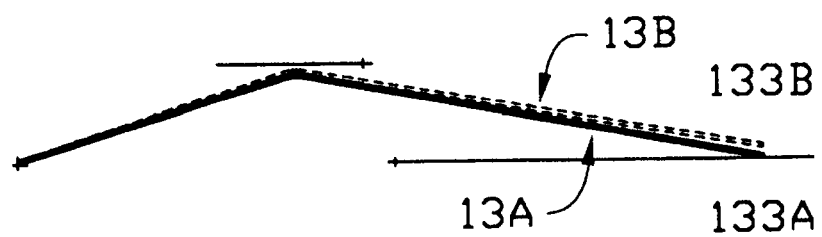
FIG. 5C is a schematic view illustrating an initial state of the spring contact in a dashed line and a final state of the spring contact after insertion in a solid line.
Figure 6:
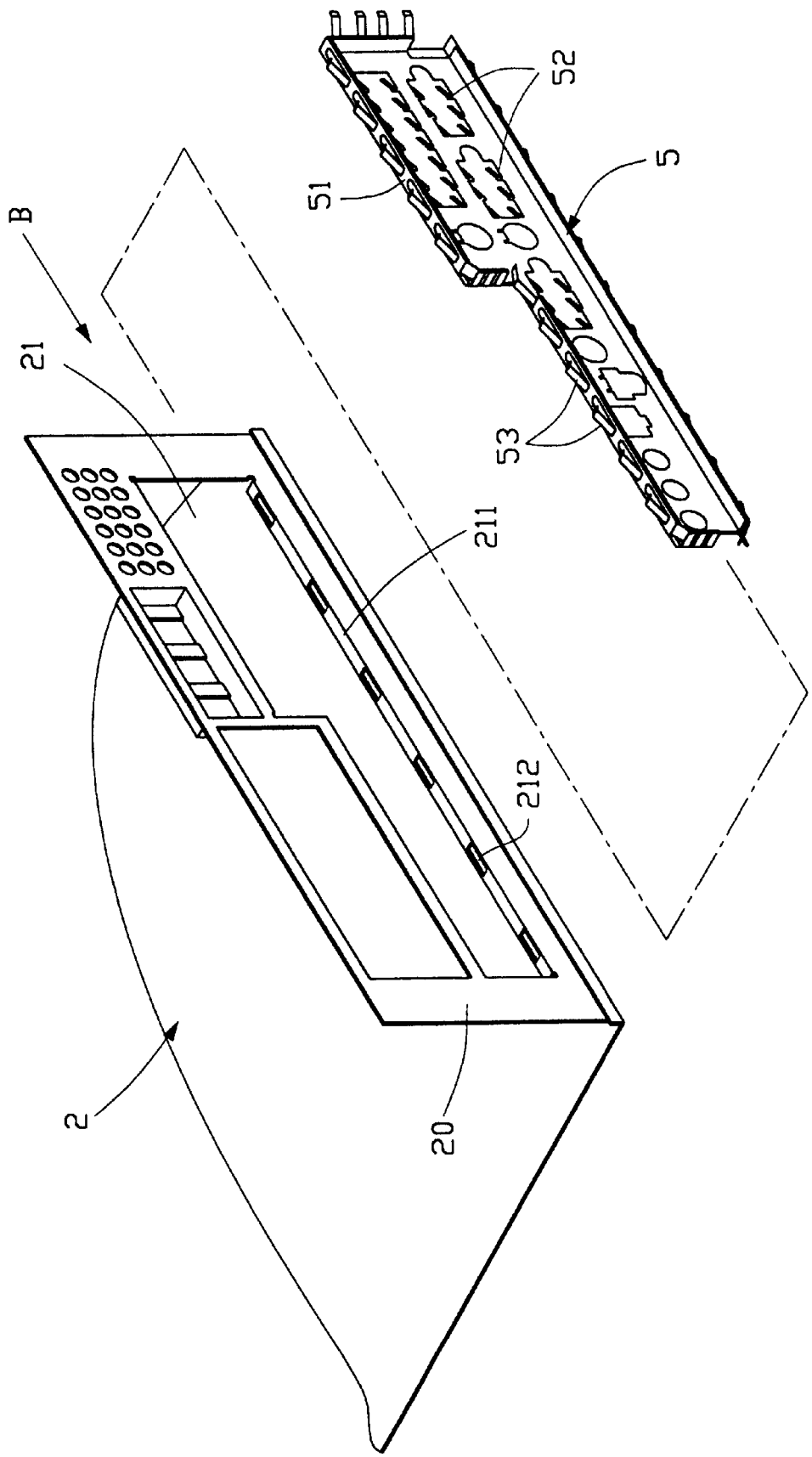
FIG. 6 is a perspective view of a conventional I/O shield and a chassis of an electronic assembly.

FIGS. 5A through 5C illustrate a sequential deformation process of the spring contact 13 during insertion into the opening 21 of the electronic assembly 2. Referring to FIG. 5A, when the bend 132 of the spring contact 13 is depressed downwards by the peripheral flange 211 of the opening 21 of the electronic assembly 2, the base 131 plastically deforms and the bend 132 resiliently deforms resulting from the fact that the bend 132 is located nearer to the base 131 than to the free end 133. When the spring contact 13 moves forward and enters into the notch 212 of the peripheral flange 211, the resiliently deformed bend 132 recovers due to release from pressure, and the free end 133 is urged to move toward the side wall 11 thereby being prevented from warping. As shown in FIG. 5B. FIG. 5C illustrates the spring contact 13A at a final state after insertion with the free end 133A located closer to the side wall 11, and the spring contact 13B at an initial state with the free end 133B extending beyond the side wall 11.

It is to be understood, however, that even though numerous characteristics of the present invention have been set forth in the foregoing description, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An I/O shield inserted into an opening of an electronic assembly that shields a mainboard installed within the electronic assembly and provides connection access for the mainboard, comprising:

a shielding plate having a reinforcing plate and a resilient plate attached together, the shielding plate having an outer shape corresponding generally to the opening of the electronic assembly, a pair of side walls respectively integrally extending from the resilient plate, a pair of latch members respectively extending inward from opposite lateral edges of the reinforcing plate relative to the electronic assembly, each latch member comprising an aperture for engaging with the mainboard; and a plurality of spring contacts formed on the side walls, each spring contact comprising a base integral with one of the side walls, a free end and a bend between the base and the free end, the tip of the bend being located nearer to the base than to the free end.

2. The I/O shield as described in claim 1, wherein the resilient plate encloses the reinforcing plate.

3. The I/O shield as described in claim 1, wherein the reinforcing plate is made from a relatively thick, rigid metal sheets whereas the resilient plate is made from a relatively thin, resilient metal sheet.

4. The I/O shield as described in claim 1, wherein the plurality of spring contacts are integrally formed on the resilient plate.

5. The I/O shield as described in claim 1, wherein the spring contacts are formed by stamping and bending.

6. The I/O shield as described in claim 1, wherein the side walls extend from the shielding plate in a direction away from an interior of the electronic assembly.

7. A shielding assembly comprising:

a chassis defining an opening having a peripheral flange, a plurality of notches formed along said flange;

a shielding plate including a resilient plate with spring contacts on said walls;

said shielding plate being adapted to slidably move with regard to the chassis under a condition that the spring contacts of the side walls of the shielding plate move along the peripheral flange of the opening; and each of said spring contacts including a base integrally formed with one of the side walls, a free end and a bend therebetween; wherein when the shielding plate moves along the chassis, the spring contact is plastically deformed around the base while elastically deformed around the free end, and thus during later movement between the shielding plate and the chassis some of the spring contacts are sprung outward and the associated bends thereof are received within the corresponding notches, but because the spring contact has been deformed the free end of each of said some of the spring contacts are not back to their original positions and will not be embedded within the corresponding notch.

* * * * *